United States Patent [19]

Leman et al.

[11] Patent Number: 5,274,274
[45] Date of Patent: Dec. 28, 1993

[54] DUAL THRESHOLD DIFFERENTIAL DISCRIMINATOR

[75] Inventors: Brooks R. Leman, Santa Clara; Balu Balakrishnan, Saratoga, both of Calif.

[73] Assignee: Power Integrations, Inc., Mountain View, Calif.

[21] Appl. No.: 856,550

[22] Filed: Mar. 23, 1992

[51] Int. Cl.$^5$ .................... H03K 5/153; H03K 17/16; H03K 17/22
[52] U.S. Cl. .................. 307/360; 307/571; 307/592; 307/584; 307/596
[58] Field of Search ............. 307/355, 360, 362, 571, 307/596, 592, 584

[56] References Cited

U.S. PATENT DOCUMENTS

| | | | |
|---|---|---|---|
| 4,950,913 | 8/1990 | Kephart | 307/592 |
| 5,099,138 | 3/1992 | Fukunaga | 307/571 |
| 5,134,322 | 7/1992 | Bourgeois et al. | 307/571 |
| 5,206,540 | 4/1993 | de Sa e Silva et al. | 307/592 |

Primary Examiner—John Zazworsky
Attorney, Agent, or Firm—Thomas E. Schatzel

[57] ABSTRACT

An embodiment of the present invention is a high-side driver comprising a pair of differential input controls each of which are coupled to a pair of comparators having first and second thresholds set at Vddh-1.5 volts and Vddh-2.5 volts, respectively. A logic block in front of a set-reset flip-flop recognizes only signals on the dual-input control lines where one is less than the Vddh-1.5 volt threshold and the other exceeds the Vddh-2.5 volt threshold. If signals on either or both of the dual-input control lines are between Vddh-1.5 volts and Vddh-2.5 volts, the logic block will prevent a change of state of the flip-flop which controls a high-voltage switch transistor connected to a load. The high-side driver further includes an under-voltage lockout to prevent false operation of the high-voltage switch transistor during the initial power up phase.

10 Claims, 4 Drawing Sheets

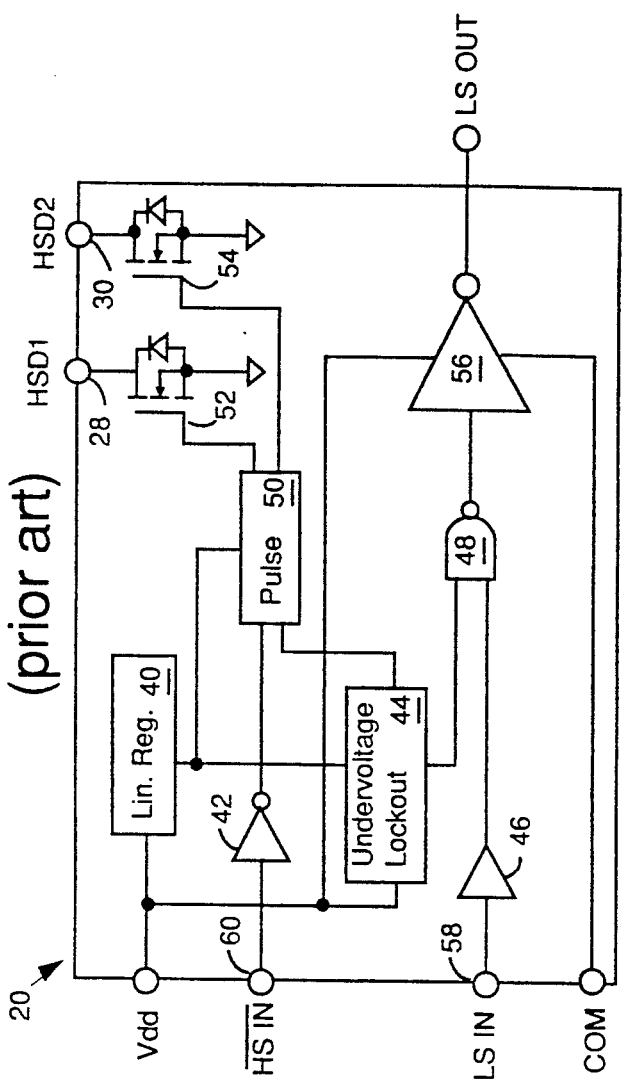
Fig._2 (prior art)
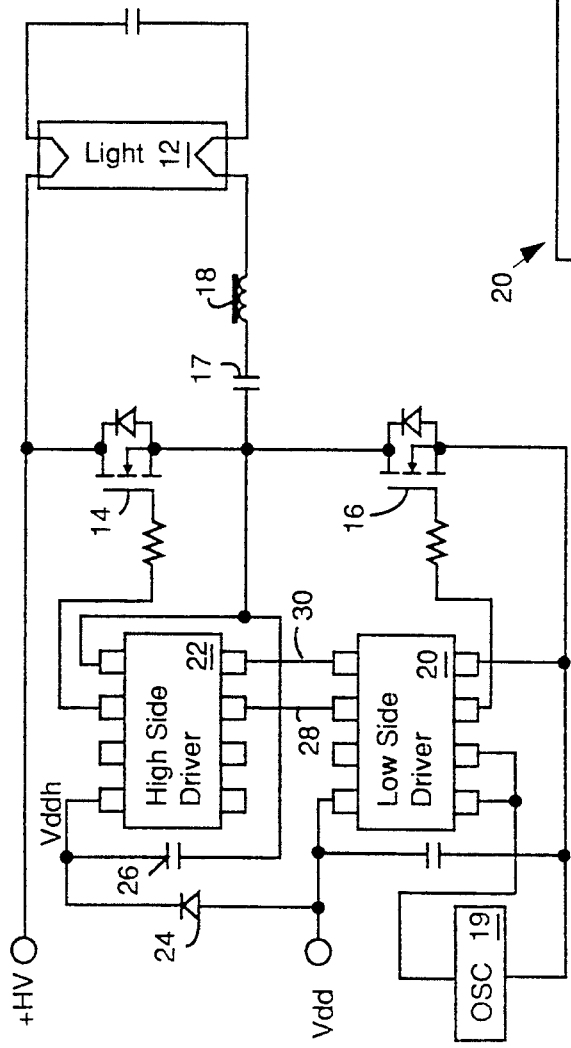
Fig._1 (prior art)

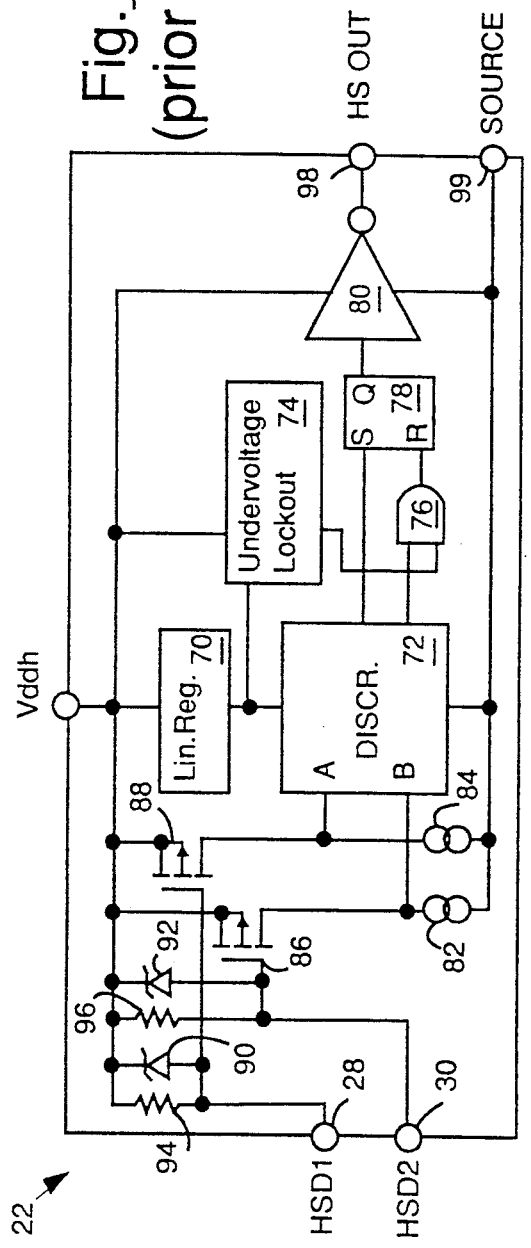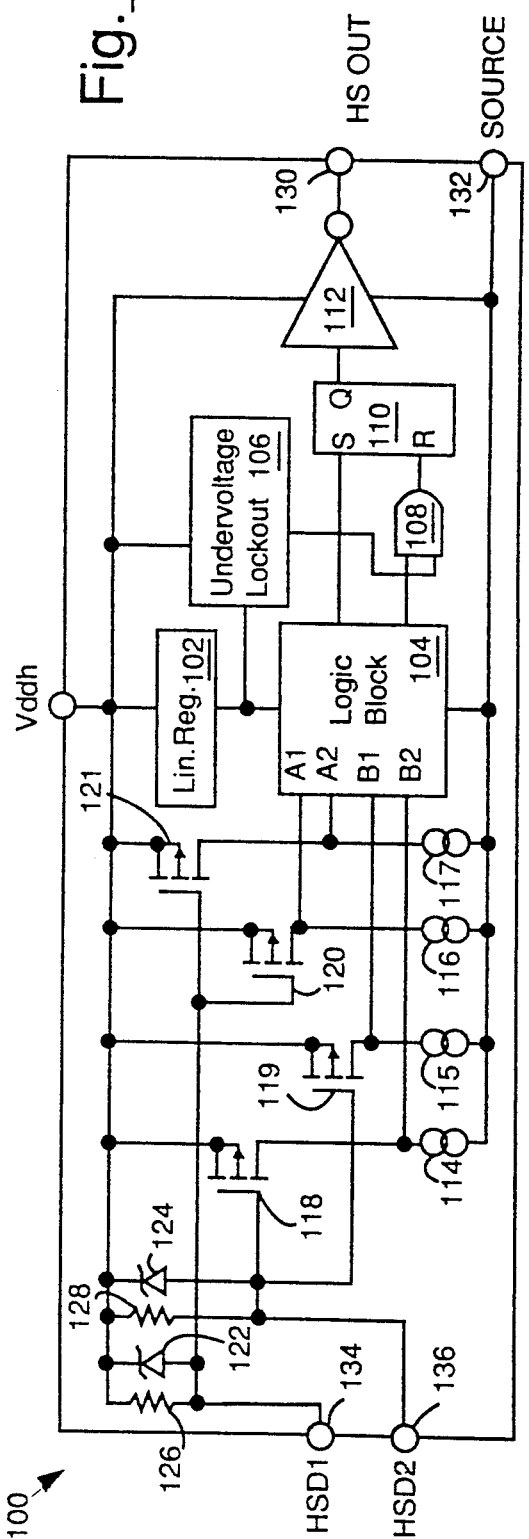

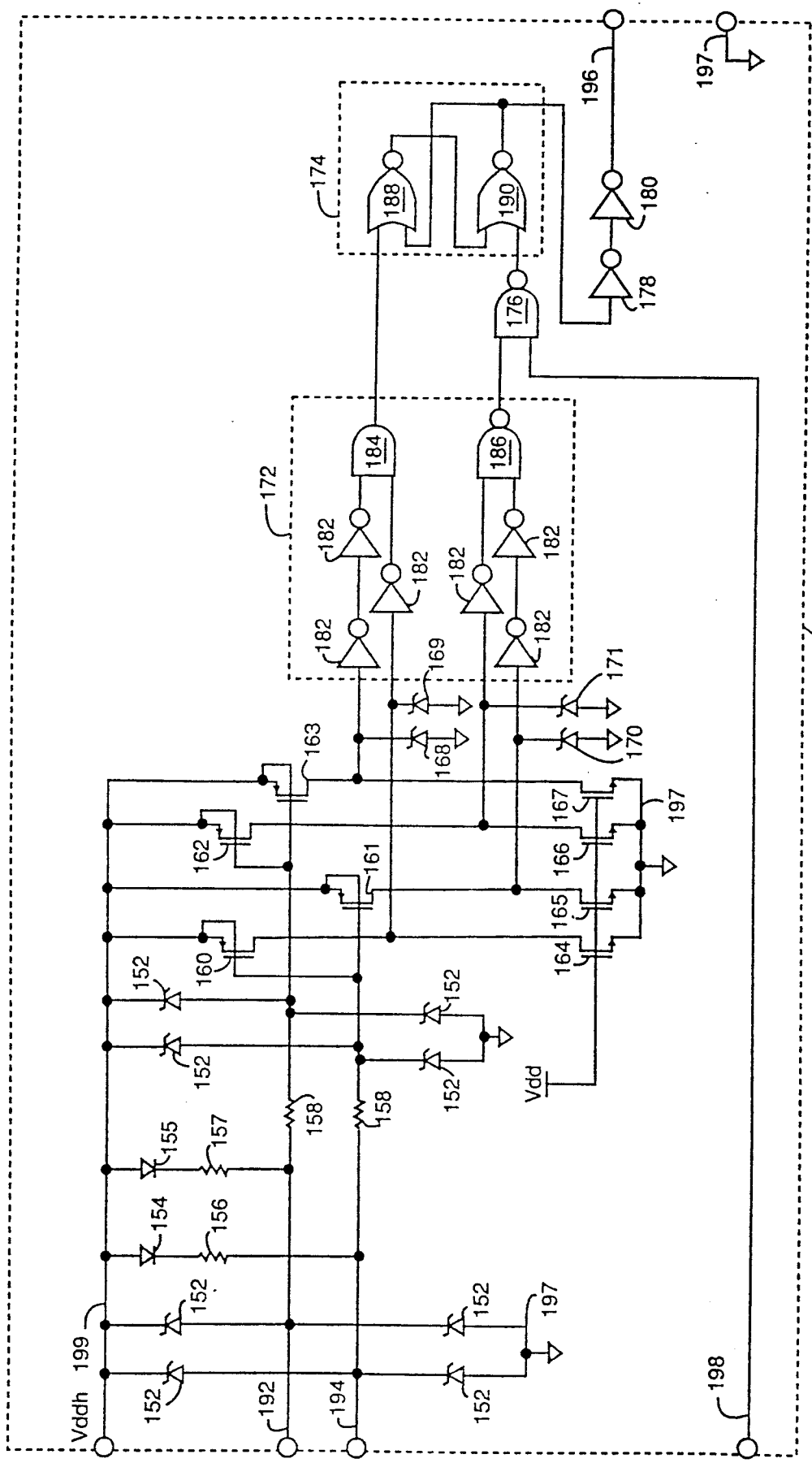
Fig._5

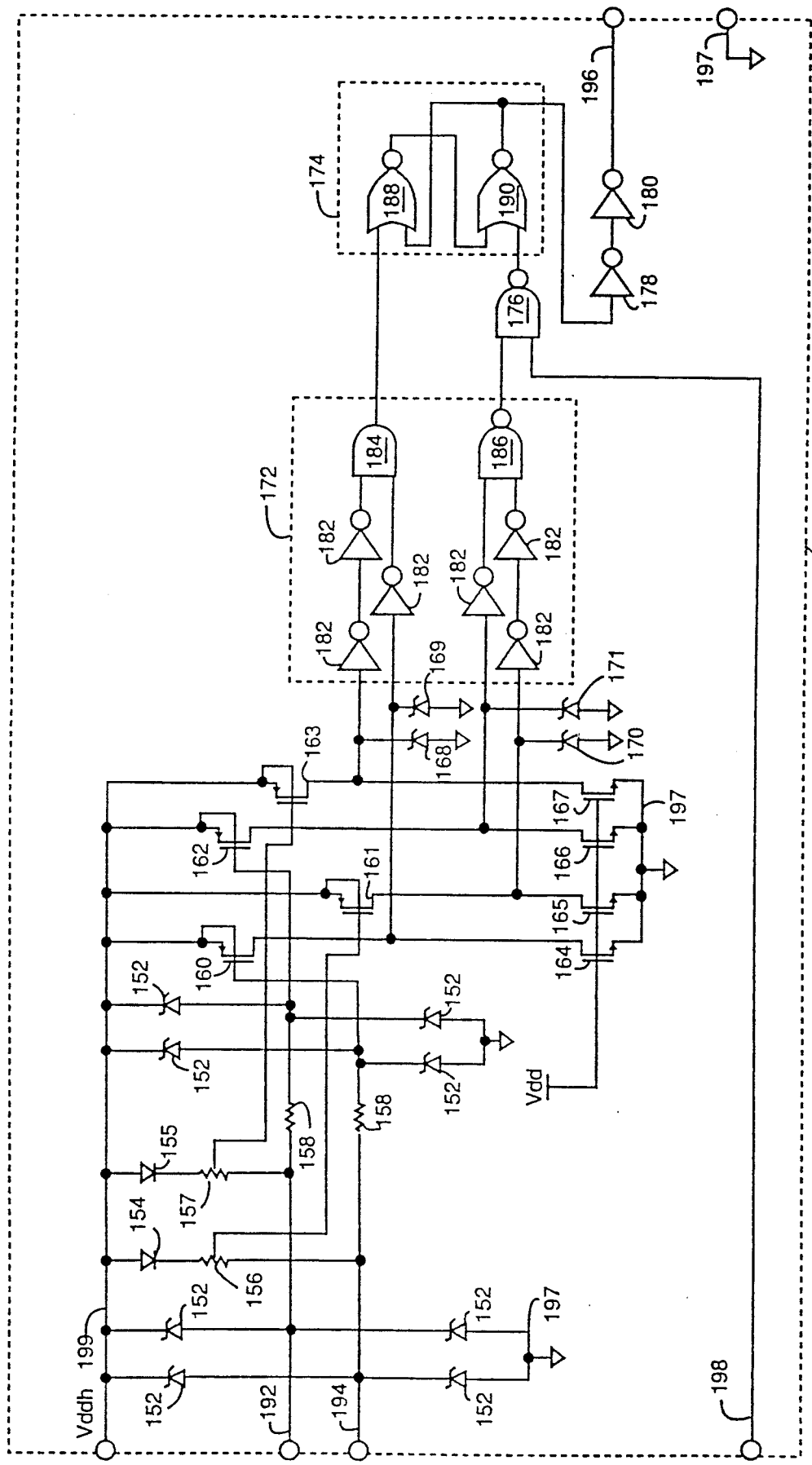
Fig._6

DUAL THRESHOLD DIFFERENTIAL DISCRIMINATOR

BACKGROUND OF THE INVENTION

1. Field of the Invention

The present invention relates to electronic power control devices and specifically to MOS-gated devices, such as MOSFET transistors and insulated gate bipolar transistors, that switch high voltages to motors and other loads in half-bridge and full-bridge multiphase configurations.

2. Description of the Prior Art

Digital logic is an almost ideal mechanism for switching power on and off to loads, especially with high-current, high-voltage MOSFET transistors that do the actual switching. However, many loads such as motors and fluorescent lights operate at voltages substantially higher than the five volts direct current (DC) used by most digital logic. Some form of level shifting is required to interface the MOSFET switch that floats at high-voltage and the digital logic that is ground referenced.

FIG. 1 illustrates a half-bridge circuit 10 for driving a fluorescent light 12. A pair of MOSFET transistors 14 and 16 switch their junction between ground and a positive high-voltage potential (+HV). The lower end of light 12 is thus driven between ground and +HV through an impedance matching circuit comprising a capacitor 17 and an inductor 18. An oscillator 19 is connected to a low-side driver 20 which in turn controls the gate of transistor 16 and a high-side driver 22 that controls the gate of transistor 14. When transistor 14 is on, transistor 16 will be off, and vice versa. A logic supply voltage (Vdd) powers low-side driver 20 directly and high-side driver 22 indirectly with the help of a bootstrap diode 24 and a bootstrap capacitor 26. Low-side driver 20 controls high-side driver 22 through a pair of control lines 28 and 30. A comparator in high-side driver 22 will latch the switch transistor 14 on and off according to the relative voltages between lines 28 and 30.

FIG. 2 illustrates the basic functional parts of low-side driver 20 which comprises a linear regulator 40, an inverter 42 with hysteresis, an under-voltage lockout 44, a buffer with hysteresis 46, a NAND-gate 48, a pulse circuit 50, a pair of transistors 52 and 54, and an output inverter driver 56 which controls the gate of transistor 16. An input 58 receives a control signal that is combined in NAND-gate 48 with an under-voltage signal from lockout 44. If the logic power Vdd falls below a predetermined threshold, driver 56 will be prevented from turning transistor 16 on. An input 60 receives an inverted control signal that will turn transistor 14 on and off by pulsing either transistor 52 or transistor 54 on and the other being off. Which line, 28 or 30, is lower than the other will be sensed by high-side driver 22 and used to ultimately control the gate of transistor 14.

FIG. 3 illustrates high-side driver 22 which comprises a linear regulator 70, a discriminator 72, an under-voltage lockout 74, an AND-gate 76, a flip-flop 78, an output driver 80, a pair of constant current sources 82 and 84, a pair of transistors 86 and 88, a pair of Zener diodes 90 and 92, and a pair of input pull-up resistors 94 and 96. An output 98 is connected to driver 80 and the gate of transistor 14. A reference common 99 connects to the source of transistor 14 and can swing from below ground in circuit 10 to above +HV, in some cases.

Diode 24 takes advantage of these swings to provide a supply voltage Vddh. If the supply voltage Vddh falls below a predetermined threshold, driver 80 will be prevented from turning transistor 14 on. Transistors 86 and 88 in a common source configuration present a high-impedance comparator input to control lines 28 and 30. If the voltage on line 30 is more negative than a predetermined threshold, e.g. Vddh-1.5 volts, and transistor 52 (FIG. 2) is off and transistor 54 is on, then the set (S) input of flip-flop 78 will go true, turning transistor 14 (FIG. 1) off. If the voltage on line 28 is more negative than the predetermined threshold, and transistor 54 (FIG. 2) is off and transistor 52 is on, then the reset (R) input of flip-flop 78 will go true, turning transistor 14 on. Table I summarizes the control function. Symbols S, R and Q are the set, reset and output, respectively, of flip-flop 78. The asterisk in the first two columns indicates negative true logic, HIGH=more negative input than threshold voltage, LOW=less negative than threshold voltage.

TABLE I

| Line 28* | Line 30* | S | R | Q |
|---|---|---|---|---|
| HIGH | LOW | HIGH | LOW | HIGH |
| LOW | HIGH | LOW | HIGH | LOW |
| HIGH | HIGH | LOW | LOW | No Change |
| LOW | LOW | LOW | LOW | No Change |

A problem develops in discriminator 72 with 5 such a simple input and logic. Noise on lines 28 and 30 can easily be induced and proper circuit 10 operation depends on a high degree of common mode noise rejection. If an imbalance develops between lines 28 and 30, such as can happen with unequal stray line capacitances and high frequency environments, false triggering of transistor 14 can occur. These false triggers can be very serious if they occur while transistor 16 is on, because +HV will momentarily find a short path to ground through transistor 14, causing a high current pulse.

A high-side driver is needed that is immune to false triggering caused by rapid common mode slewing of the control lines. An improved threshold region of the comparators is needed to prevent a slight mismatching of the control lines to trigger an unintended change of state.

SUMMARY OF THE PRESENT INVENTION

It is therefore an object of the present invention to provide a power control system that prevents false triggering of high-side, floating switch control transistors.

Briefly, an embodiment of the present invention is a high-side driver comprising a pair of differential input controls each of which are coupled to a pair of comparators having first and second thresholds set at Vddh-1.5 volts and Vddh-2.5 volts, respectively. A logic block in front of a set-reset flip-flop recognizes only signals on the control lines where one is less than the Vddh-1.5 volt threshold and the other exceeds the Vddh-2.5 volt threshold. If signals on either or both of the control lines are between Vddh-1.5 volts and Vddh-2.5 volts, the logic block will prevent a change of state of the flip-flop which controls a high-voltage switch transistor connected to a load. The high-side driver further includes an under-voltage lockout to prevent false operation of the high-voltage switch transistor during the initial power up phase.

An advantage of the present invention is that a high-side driver is provided that has an increased level of common mode rejection on the control inputs.

Another advantage of the present invention is that a high-side driver is provided that substantially eliminates false triggering of the output by high-frequency and high-voltage switching of a load.

Another advantage of the present invention is that a high-side driver is provided that is less sensitive to control line routing and device placement on a printed circuit board.

Another advantage of the present invention is that a high-side driver can be implemented with a small number of circuit elements.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic block diagram of a half-bridge power control system with a prior art high-side and low-side drivers;

FIG. 2 is a schematic block diagram of the prior art low-side driver of FIG. 1;

FIG. 3 is a schematic block diagram of the prior art high-side driver of FIG. 1;

FIG. 4 is a schematic block diagram of a dual-threshold high-side driver, according to a first embodiment of the present invention;

FIG. 5 is a schematic diagram of a dual-threshold high-side driver, according to a second embodiment of the present invention; and FIG. 6 is a schematic diagram of a dual-threshold high-side driver, according to an alternative embodiment of the driver of FIG. 5.

DETAILED DESCRIPTION OF THE EMBODIMENTS

In FIG. 4, an embodiment of the present invention is a high-side transistor driver 100 comprising a linear regulator 102, a four-input logic block 104, an under-voltage lockout 106, an AND-gate 108, a flip-flop 110, an output driver 112, a set of four constant current sources 114–117, a set of four transistors 118–121, a pair of Zener diodes 122 and 124, and a pair of input pull-up resistors 126 and 128. An output 130 couples driver 112 to the gate of an external high-voltage switch transistor (e.g., transistor 14 in FIG. 1). A reference 132 connects to the source of the external switch transistor. A pair of control input lines 134 and 136 receive a differential signal from a low side driver (e.g., low-side driver 20 in FIG. 1). Transistors 120 and 119, together with constant current sources 116 and 115, form a 1.5 volt comparator function for inputs "A1" and "B1" of logic block 104, respectively. Transistors 121 and 118 with constant current sources 117 and 114, form a 2.5 volt comparator function for inputs "A2" and "B2" of logic block 104, respectively. Input "A1" will be true whenever the voltage on line 134 drops more than 1.5 volts more negative than Vddh, which serves as a reference. Input "A2" will be true whenever the voltage on line 134 drops more than 2.5 volts more negative than Vddh. Input "B1" will be true whenever the voltage on line 136 drops more than 1.5 volts more negative than Vddh. Input "B2" will be true whenever the voltage on line 136 drops more than 2.5 volts more negative than Vddh. Logic block 104 is such that it recognizes only signals on the control lines 134 and 136 where one is less than the Vddh-1.5 volt threshold and the other exceeds the Vddh-2.5 volt threshold. If signals on either or both of the control lines 134 and 136 are between Vddh-1.5 volts and Vddh-2.5 volts, or both are less negative than Vddh-1.5 volts or both are more negative than Vddh-2.5 volts, logic block 104 will prevent a change of state of flip-flop 110. Table II summarizes the logic states that result for various combinations of input voltages (X) on line 134 and input voltages (Y) on line 136. These voltages are negative, with respect to Vddh. The set, reset and output of flip-flop 110 are "S", "R" and "Q", respectively. It is assumed in Table II that an under-voltage condition does not exist, so "R" is received only from logic block 104. The asterisk in the first two columns of Table II is meant to call attention to the fact that voltage threshold one ($V_{T1}$) represents Vddh-1.5 volts and voltage threshold two ($V_{T2}$) represents Vddh-2.5 volts.

TABLE II

| Line 134* | Line 136* | A1 | A2 | B1 | B2 | S | R | Q |
|---|---|---|---|---|---|---|---|---|
| $X > V_{T2}$ | $Y < V_{T1}$ | 1 | 1 | 0 | 0 | 1 | 0 | 1 |
| $X < V_{T1}$ | $Y > V_{T2}$ | 0 | 0 | 1 | 1 | 0 | 1 | 0 |
| $X > V_{T2}$ | $V_{T1} < Y < V_{T2}$ | 1 | 1 | 1 | 0 | 0 | 0 | n/c |
| $V_{T1} < X < V_{T2}$ | $Y > V_{T2}$ | 1 | 0 | 1 | 1 | 0 | 0 | n/c |
| $X > V_{T2}$ | $Y > V_{T2}$ | 1 | 1 | 1 | 1 | 0 | 0 | n/c |
| $X < V_{T1}$ | $Y < V_{T1}$ | 0 | 0 | 0 | 0 | 0 | 0 | n/c |
| $V_{T1} < X < V_{T2}$ | $V_{T1} < Y < V_{T2}$ | 1 | 0 | 1 | 0 | 0 | 0 | n/c |

"n/c" = no change in state.

A second embodiment of the present invention is illustrated in FIG. 5. A dual-threshold discriminator 150 is functionally equivalent to high-side driver 100, except that a linear regulator and under-voltage detector are not included. These functions can be provided externally. Discriminator 150 comprises a plurality of input protection Zener diodes 152, a pair of clamping diodes 154 and 155 with a pair of dropping resistors 156 and 157, a pair of series input resistors 158, a set of four comparison transistors 160–163, a set of four constant current sources 164–167, a set of four logic protection Zener diodes 168–171, a logic block 172, a flip-flop 174, a NAND-gate 176, and a pair of output inverters 178 and 180. Logic block 172 includes a plurality of inverters 182, an AND-gate 184 and a NAND-gate 186. Flip-flop 174 is constructed of a pair of NOR-gates 188 and 190. A dual-input control signal is received on a pair of lines 192 and 194 and an output line 196 controls the gate of an external high-side, high-voltage switch transistor that has its source connected to a common 197. An under-voltage control signal is received on an input 198. Power (Vddh) to operate discriminator 150 is supplied to a terminal 199.

The two different threshold voltages above are obtained by adjusting the relative sizes of transistors 160–163. Alternatively, transistors 160–163 can be the same size and the current through constant-current sources 164-167 can be individually adjusted to set the two thresholds.

A still further alternative is to use voltage taps on resistors 156 and 157, as shown in FIG. 6, for a discriminator 150' which is similar to discriminator 150. The gate of transistor 163 has a tap on resistor 157. The gate of transistor 161 is similarly tapped on resistor 156. Transistors 161 and 163 with constant current sources 165 and 167 form the 1.5 volt threshold comparator.

Although the present invention has been described in terms of the presently preferred embodiments, it is to be understood that the disclosure is not to be interpreted as limiting. Various alterations and modifications will no doubt become apparent to those skilled in the art after having read the above disclosure. For example, in FIG. 4, the circuitry between lines 134 and 136 and driver 112 could be replaced by an op-amp configured to accept differential voltage inputs and that has a small amount of the output signal fed back to the non-inverting terminal. A differential hysteris effect is created in which a difference of voltage on control lines 134 and 136 must exceed some minimum set by the amount of positive feedback in order for the output to switch state. Linear circuits could also be used in a configuration that compares the control lines 134 and 136 independently to the two thresholds. However, the current state-of-the-art is such that such linear circuits are limited in their frequency ranges and add a level of complexity that increases the costs of manufacturing. The limitations of such configurations, however, may improve with future developments in those areas. Accordingly, it is intended that the appended claims be interpreted as covering all alterations and modifications as fall within the true spirit and scope of the invention.

What is claimed is:

1. A power controller for substantially eliminating false triggering of an output by high-frequency and/or high-voltage switching of a load, comprising:

first and second control lines for signaling a high-side high-voltage switch transistor to switch said load on or off;

a first comparator having a first threshold coupled to the first and second control lines;

a second comparator having a second threshold coupled to the first and second control lines, said second threshold being substantially different from said first threshold;

first logic means for turning said high-side high-voltage switch transistor on when a first signal on the first control line has a magnitude greater than the magnitudes of both said first and second thresholds and a second signal on the second control line has a magnitude less than the magnitudes of both said first and second thresholds and that prevents aid high-side high-voltage switch transistor from turning on for any other condition of said first and second signals; and second logic means for turning said high-side high-voltage switch transistor off when said first signal on the first control line has a magnitude less than the magnitudes of both said first and second thresholds and said second signal on the second control line exceeds both said first and second thresholds and that prevents said high-side high-voltage switch transistor from turning off for any other condition of said first and second signals.

2. The power controller of claim 1, wherein:
said first threshold in the first comparator is approximately 1.5 volts.

3. The power controller of claim 1, wherein:
said second threshold in the second comparator is approximately 2.5 volts.

4. The power controller of claim 1, wherein:
the first and second logic means each comprise a NAND-gate having respective connections to the set and reset inputs of a flip-flop.

5. The power controller of claim 4, wherein:
said flip-flop has an output that controls a buffer driver for controlling the gate of said high-voltage switch transistor.

6. The power controller of claim 1, further comprising:
at least one pair of Zener diodes connected to each of the first and second control lines for limiting the voltage excursions of signals received on the first and second control lines.

7. The power controller of claim 1, wherein:
the first and second comparators comprise a plurality of transistors and constant current sources and have respective thresholds that are determined by the relative physical sizes of said transistors.

8. The power controller of claim 1, wherein the first and second comparators comprise a plurality of transistors and constant current sources and have respective thresholds that are determined by said constant current sources set to differing levels.

9. The power controller of claim 1, wherein:
the first and second comparators comprise a pair of resistors for dropping incoming control signals and a plurality of transistors and constant current sources and have respective thresholds that are determined by taps on said dropping resistors.

10. A high-side transistor driver, comprising:
a logic block having a first through a fourth signal input and a first and a second signal output;

an under-voltage lockout for disabling said second signal output during an undervoltage condition as detected by an undervoltage detection means coupled to a power input;

an output driver for driving the gate of a high-side transistor connected to a load;

a flip-flop for receiving said first and second signal outputs of the logic block and for switching the output driver on and off wherein said load is thereby controlled;

a first through a fourth constant current source; and a first through a fourth transistor respectively connected at their sources to each of the first through fourth constant current sources and said first through fourth signal inputs to the logic block with the gates of the first and second transistors connected to a first control input and the gates of the third and fourth transistors connected to a second control input, wherein the logic block is responsive to a pair of signals on said first and second control inputs where one is less than a first threshold voltage and the other exceeds a second threshold voltage, different from said first threshold voltage, and wherein if said pair of signals on either or both of said first and second control are between said first and second threshold voltages, or are both less than said first threshold voltage or are both more than said second threshold voltage, then the logic block is such that a change of state of the flip-flop is prevented.

* * * * *